(12) United States Patent
Lin et al.

(10) Patent No.: US 6,492,073 B1
(45) Date of Patent: Dec. 10, 2002

(54) REMOVAL OF LINE END SHORTENING IN MICROLITHOGRAPHY AND MASK SET FOR REMOVAL

(75) Inventors: Burn Jeng Lin, Hsin chu (TW); Ru-Gun Liu, Hsin-Chu (TW); Shih-Ying Chen, Taichung (TW); Shinn-Sheng Yu, Taichung (TW); Hua-Tai Lin, Yu-Kang (TW); Anthony Yen, Hsin-Chu (TW); Yao-Ching Ku, Hsin Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 86 days.

(21) Appl. No.: 09/839,926

(22) Filed: Apr. 23, 2001

(51) Int. Cl.$^7$ ............................... G03F 9/00; G03C 5/00
(52) U.S. Cl. ............................ 430/5; 430/22; 430/312; 430/328; 430/394
(58) Field of Search ............................ 430/5, 22, 312, 430/328, 394

(56) References Cited

U.S. PATENT DOCUMENTS 5,308,741 A   5/1994   Kemp ........................ 430/312
5,686,223 A   11/1997  Cleeves ...................... 430/312
5,807,649 A   9/1998   Liebmann et al. ............. 430/5

Primary Examiner—Christopher G. Young
(74) Attorney, Agent, or Firm—George O. Saile; Stephen B. Ackerman; Larry J Prescott

(57) ABSTRACT

A mask set of two masks and a method of using these masks in a double exposure to avoid line shortening due to optical proximity effects is described. A pattern having pattern elements comprising a number of line segments, wherein each of the line segments has one or two free ends which are not connected to other mask pattern elements is to be transferred to a layer of resist. A first mask is formed by adding line extensions to each of the free ends of the line segments. A cutting mask is formed comprising rectangles enclosing each of the line extensions wherein one of the sides of said rectangles is coincident with the corresponding free end of said line segment. The first mask has opaque regions corresponding to the extended line segments. The cutting mask has transparent regions corresponding to the cutting pattern. In another embodiment a pattern having pattern openings comprising a number of line segments. In this embodiment the cutting pattern comprises rectangles having the same width as said line segments and add length to the line segments.

20 Claims, 13 Drawing Sheets

REMOVAL OF LINE END SHORTENING IN MICROLITHOGRAPHY AND MASK SET FOR REMOVAL

BACKGROUND OF THE INVENTION (1) Field of the Invention

This invention relates to masks and methods for optical proximity correction of pattern images, and more particularly to the correction of line end shortening caused by optical proximity effects.

(2) Description of the Related Art

An important concern in the manufacture of integrated circuit devices is pattern distortion caused by optical proximity effects, particularly as critical dimensions in these patterns decreases. Much work has been done in developing methods to compensate for this pattern distortion.

U.S. Pat. No. 5,807,649 to Liebmann et al. describes a lithographic patterning method and mask set using a phase shift trim mask having mask dimensions increased in block size so as to remove previous exposure defects.

U.S. Pat. No. 5,308,741 to Kemp describes a lithographic method using double exposures, physical mask shifting, and phase shifting masks.

U.S. Pat. No. 5,686,223 to Cleeves describes a lithographic patterning method using multiple exposures to provide for relatively reduced pitch for features of a single patterned layer.

SUMMARY OF THE INVENTION

As optical lithography is used to delineate 0.1 micron and smaller features, it inevitably works in a low $k_1$ region. For example, for a 193 nanometer wavelength and a numerical aperture of 0.63 the value of $k_1$, which is equal to the feature size multiplied by the numerical aperture and divided by the wavelength is equal to 0.33. At this low value of $k_1$ the length of lines shortens when the width of the lines is kept at the desired dimension. Conventional solutions to this line shortening have included widening of the line at the line ends. This widening of the line ends takes additional space on the integrated circuit element however, which also limits the density of wiring in the circuit element.

It is a principle objective of this invention to provide a method of forming pattern line elements without line shortening without widening line ends, using double exposure and two masks.

It is another principle objective of this invention to provide a method of forming pattern line openings without line shortening without widening line ends, using double exposure and two masks.

It is another principle objective of this invention to provide a mask set of two masks for forming pattern line elements without line shortening without widening line ends, using double exposure and the two mask set.

It is another principle objective of this invention to provide a mask set of two masks for forming pattern line openings without line shortening without widening line ends, using double exposure and the two mask set.

These objectives are accomplished by forming a modified pattern mask and a cutting mask. A pattern having pattern elements comprising a number of line segments, wherein each of the line segments has one or two free ends which are not connected to other mask pattern elements is to be transferred to a layer of resist. Extended line segments are formed by adding line extensions to each of the free ends of the line segments, thereby forming a modified pattern. A cutting pattern is formed comprising rectangles enclosing each of the line extensions wherein one of the sides of said rectangles is coincident with the corresponding free end of said line segment.

A first mask having opaque regions corresponding to said modified pattern is then formed. A second mask having transparent regions corresponding to the cutting pattern is also formed. The layer of resist is then formed using a first exposure and the first mask. Next the layer of resist is exposed using a second exposure and the second mask for removing any excess line length. When the layer of resist is developed lines having the proper length result.

In another embodiment a pattern having pattern openings comprising a number of line segments, wherein each of the line segments has one or two free ends which are not connected to other mask pattern elements. A cutting pattern comprising rectangles having the same width as said line segments, add length to each of the free ends of the line segments, and overlap the free ends of said line segments is then formed.

A first mask having transparent regions corresponding to the pattern is formed. A second mask having transparent regions corresponding to the cutting pattern is also formed. The layer of resist is then exposed using a first exposure and the first mask. The layer of resist is then exposed using a second exposure and the second mask. When the layer of resist is developed lines openings having the proper length result.

The masks and method of this invention will work for forming images in either positive or negative resist.

DESCRIPTION OF THE PREFERRED EMBODIMENTS

Figure 1:
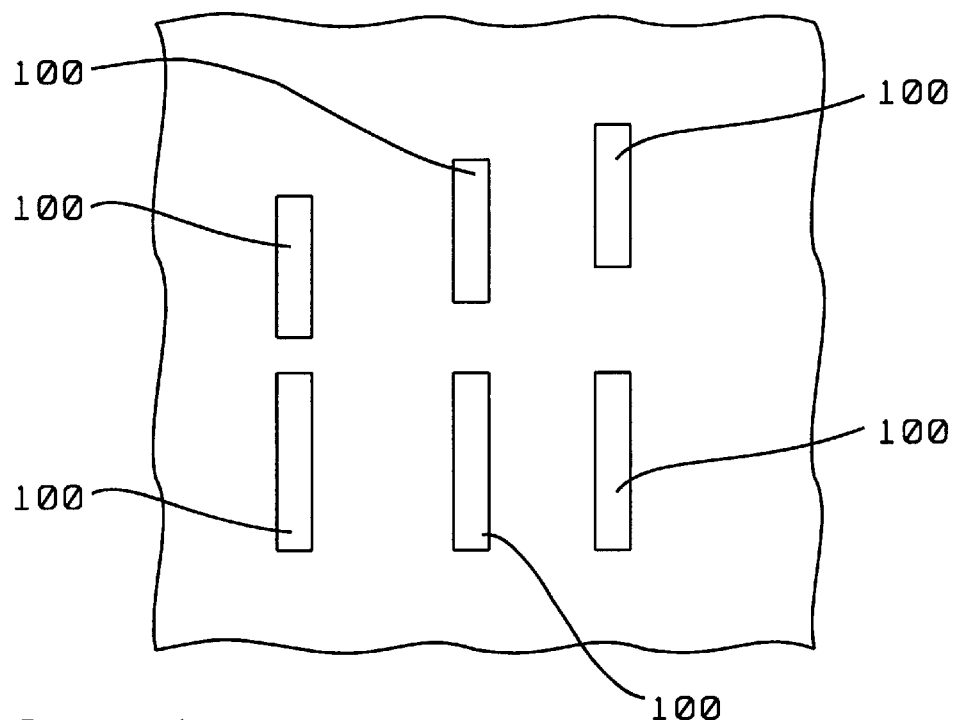
FIG. 1 shows a pattern having a number of collinear line segments.

Refer now to FIGS. 1–19 for a detailed description of the preferred embodiments of this invention. The key to this invention is to form a set of two masks to transfer a pattern comprising lines which will become shortened by the photolithographic process to a layer of resist. This is accomplished by extending the length of each of the free ends of the pattern elements, thereby forming a first mask. A second mask is then formed to cut the ends of the lines to the proper length. A layer of resist is first exposed using the first mask and a first exposure. The layer of resist is then exposed using the second mask and a second exposure. FIG. 19 shows a schematic diagram of a photolithographic mask alignment and projection system. A substrate 708, usually an integrated circuit wafer, having a layer of resist 706 formed thereon is placed in a substrate holder 710. The masks 702 are placed in a mask holder 704. The mask holder 704 and substrate holder 710 are positioned to achieve the proper alignment between the masks 702 and layer of resist 706. A radiation source 700, usually a light source, supplies radiation to pass through the masks 702 and the lens 705. The radiation passing through the masks 702 is focussed by the lens 705 to expose the layer of resist 706 so that the image of the masks 702 is transferred to the layer of resist 706. After exposure using the first and second masks the substrate 708 is removed and the layer of resist 706 is developed.

FIG. 1 shows a top view of a pattern to be transferred to a layer of resist. In this embodiment the pattern elements, 100 and 102, are to be transferred as remaining resist in a layer of developed positive resist or openings in the resist in a layer of developed negative resist. FIG. 1 shows the example of a pattern wherein some of the pattern elements 100 at the top of the pattern are collinear with one of the pattern elements 102 at the bottom of the pattern.

Figure 2:
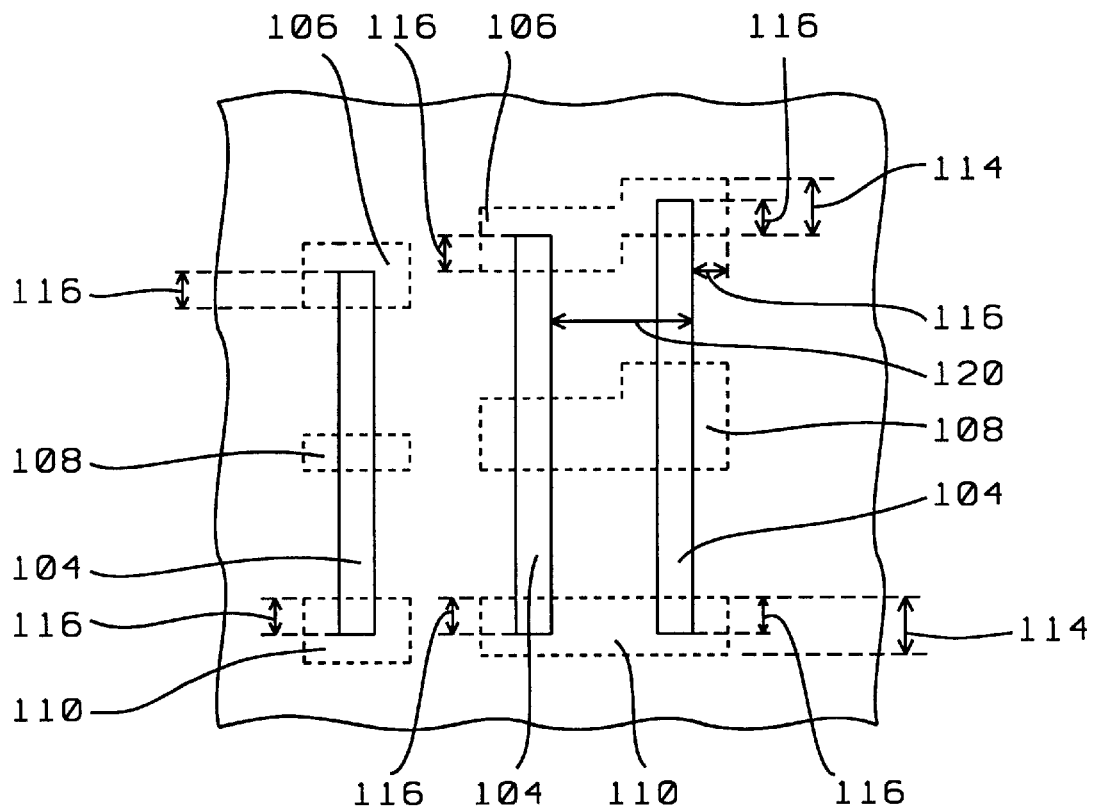
FIG. 2 shows the modified pattern and cutting pattern for the pattern of FIG. 1.

FIG. 2 shows a top view of both the first and second mask showing the rules used to form the masks. The first mask pattern is shown using solid lines in FIG. 2. The bottom ends of the line segments at the top of the pattern, reference number 100 in FIG. 1, and the top ends of the line segments at the top of the pattern, reference number 102 in FIG. 1, are extended until they meet forming extended line segments, reference number 104 in FIG. 2. The top ends of the line segments at the top of the pattern, reference number 100 in FIG. 1, and the bottom ends of the line segments at the top of the pattern, reference number 102 in FIG. 1, are extended a first distance 116. The extended line segments, 104 in FIG. 2, will be opaque regions of the first mask. The first distance is greater than the expected reduction of length at one end of the line segments. In this example the line segments at the top of the pattern and the line segments at the bottom of the pattern are extended until they meet. This is done unless the distance between the bottom of the line segments at the top of the pattern and the top of the line segments at the bottom of the pattern is greater than the largest expected reduction of length at one end of the line segments multiplied by ten.

As shown by the dashed lines in FIG. 2 a cutting pattern is located at the positions where the length of the lines is to be cut. FIG. 2 shows a number of cutting pattern elements 106 at the top of the extended line segments 104, cutting pattern elements 110 at the bottom of the extended line segments 104, and cutting elements 108 at the center of the extended line segments 104. The cutting elements, 106, 108, and 110 are a number of rectangles. The cutting elements, 106 and 110, at the top and bottom of the extended line segments 104 are positioned to cut the first distance 116 from the line segment ends. These cutting elements have a height 114 of at least two times the first distance. The cutting elements 108 at the center of the extended line segments 104 are located to cut the extended line segments to duplicate the line segments of the original pattern. The width of the cutting elements, 106, 108, and 110, is large enough to extend a distance 120 beyond the edge of the extended line segments 104 which is greater than the largest expected reduction of length at one end of the line segments. If the separation 120 between the extended line segments 104 is less than the largest expected reduction of length at one end of the line segments multiplied by ten the width of the cutting pattern elements, 106, 108, and 110, is extended until the cutting pattern elements meet.

Figure 3A:
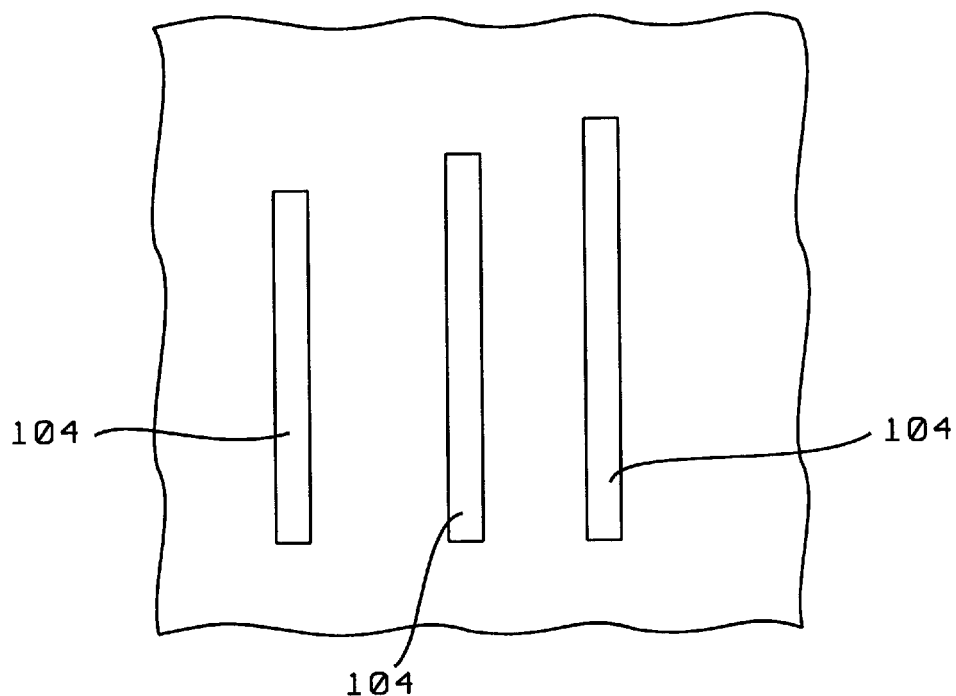
FIG. 3A shows the mask for the modified pattern of FIG. 2.
Figure 3B:
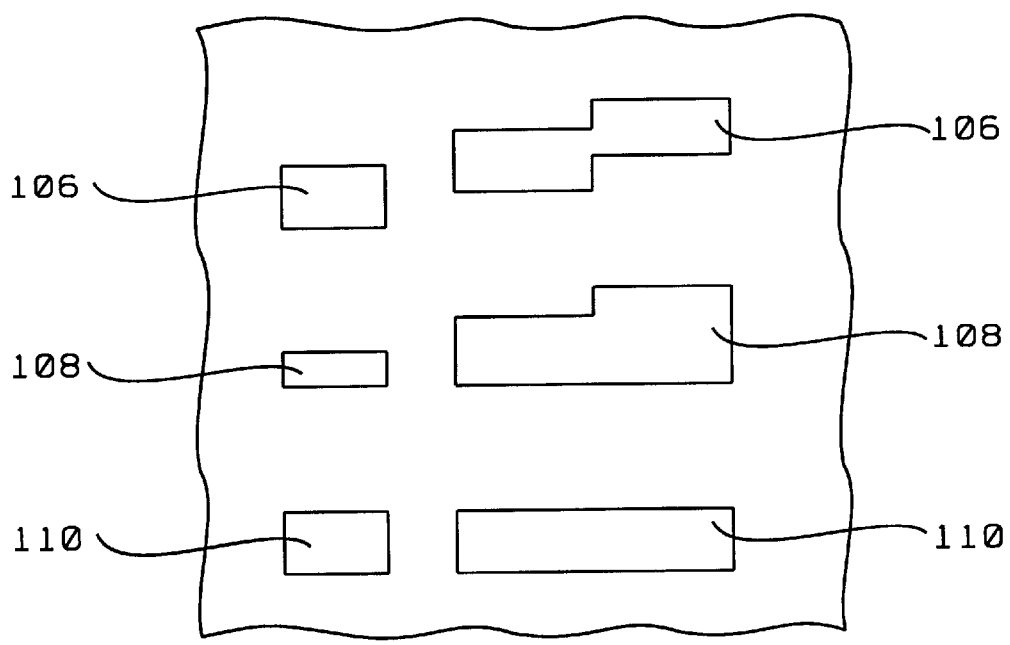
FIG. 3B shows the cutting mask for the modified pattern of FIG. 2.

FIG. 3A shows a top view of the first mask showing the extended line segments 104. The extended line segments 104 will be opaque regions on the first mask. FIG. 3B shows a top view of the second mask or cutting mask showing the cutting elements, 106, 108, and 110. The cutting elements, 106, 108, and 110 are transparent regions of the cutting mask.

FIG. 19 shows a schematic diagram of a photolithographic mask alignment and projection system. A substrate 708, usually and integrated circuit wafer, having a layer of resist 706 formed thereon is placed in a substrate holder 710. The masks 702 are placed in a mask holder 704. The mask holder 704 and substrate holder 710 are positioned to achieve the proper alignment between the masks 702 and layer of resist 706. A radiation source 700, usually a light source, supplies radiation to pass through the masks 702 and expose the layer of resist 706. The first mask, shown in FIG. 3A, is first placed in the mask holder 704 and the layer of resist is exposed. This leaves the extended line segments 104 unexposed. The second mask, shown in FIG. 3B, is then placed in the mask holder and the layer of resist is exposed a second time. This exposes the extended regions of the extended line segments 104 so that they will be removed during development of the resist. Since the line shortening has taken place before the exposure using the cutting pattern, this method avoids line shortening in the final resist pattern.

The method just described with reference to FIGS. 1–3B, and 19, is the method used to avoid line shortening while forming the image of line segments in a layer of resist. Refer now to FIGS. 4–15B for a description of additional mask embodiments having opaque pattern elements in the first mask and transparent cutting elements in the cutting mask, and layout ground rules for forming these masks. These masks and this method will work for the case of either positive or negative resist.

Figure 4:
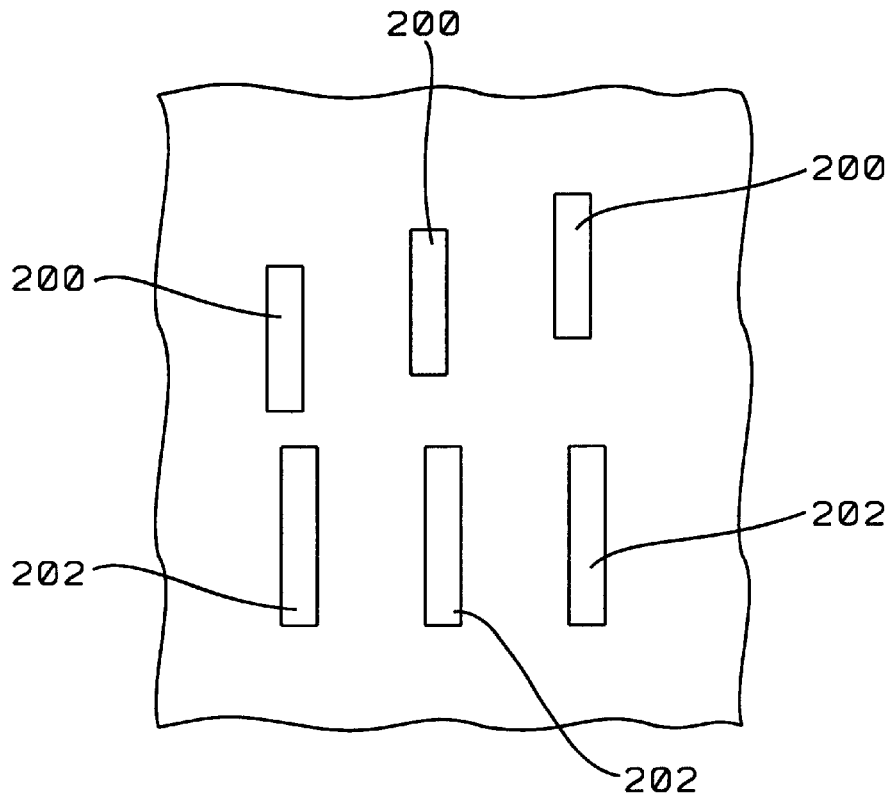
FIG. 4 shows a pattern having a number of off set line segments.
Figure 5:
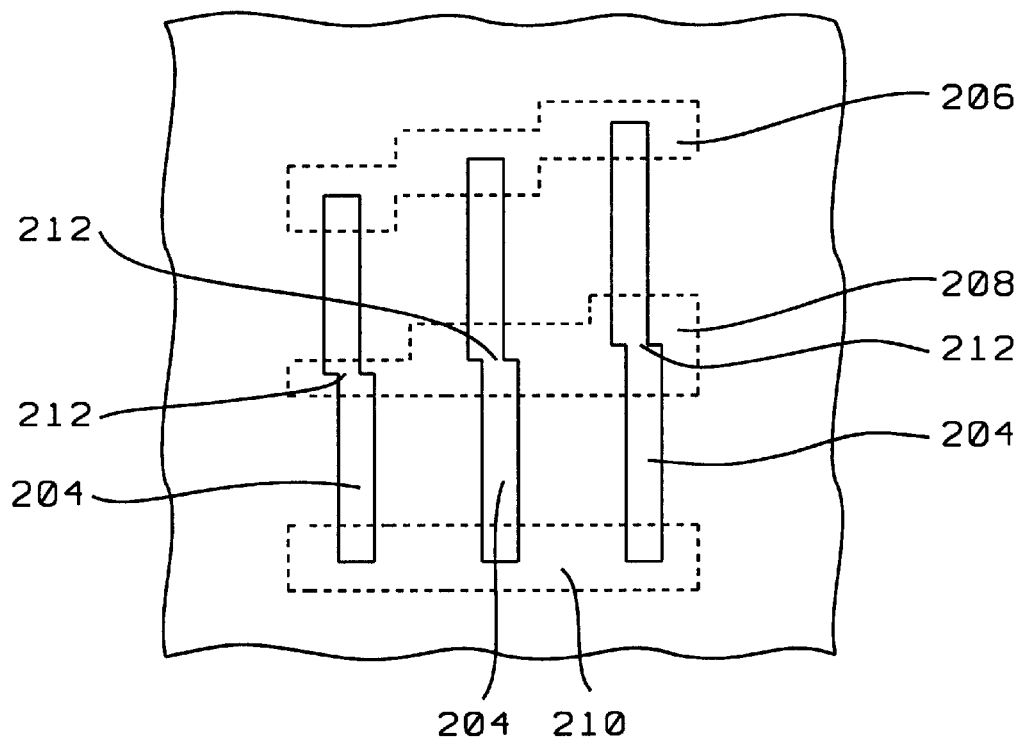
FIG. 5 shows the modified pattern and cutting pattern for the pattern of FIG. 4.

FIG. 4 shows a pattern having line segments, 200 and 202, which are not collinear but which would contact each other if the line segments were extended toward one another. FIG. 5 shows the diagram of the extended line segments 204 for the first mask and the cutting elements, 206, 208, and 210, for the second mask or cutting mask. In this embodiment the bottom ends of the lines 200 at the top of the pattern and the top ends of the lines 202 at the bottom of the pattern, see FIG. 4, are extended until the lines meet as shown in FIG. 5. The meeting point 212 of the lines is located midway between the bottom ends of the lines 200 at the top of the pattern and the top ends of the lines 202 at the bottom of the pattern. The rules for extending the lines at the top ends of the lines 200 at the top of the pattern and the bottom ends of the lines 202 at the bottom of the pattern are the same as described in the previous example. The rules for forming the cutting elements 206, 208, and 210 are also the same as described in the previous example.

Figure 6A:
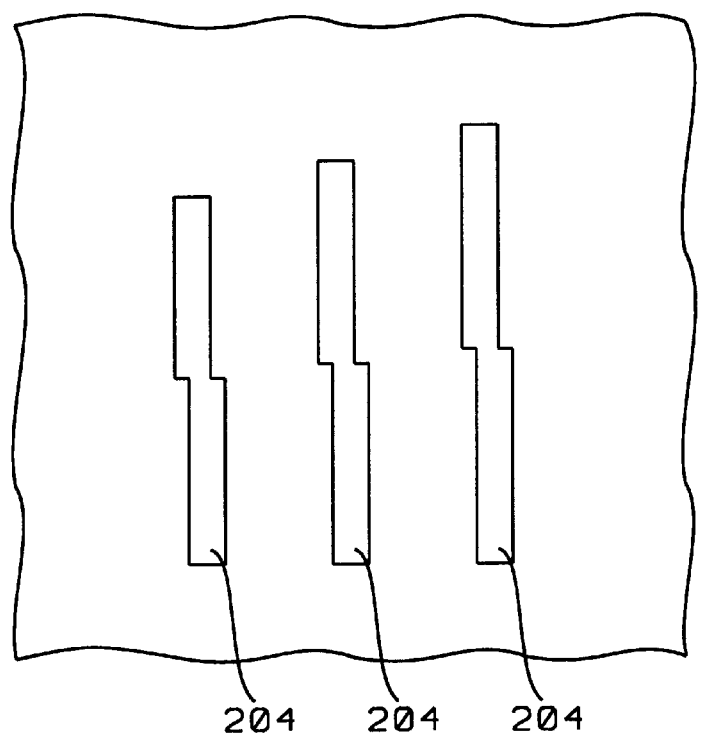
FIG. 6A shows the mask for the modified pattern of FIG. 5.
Figure 6B:
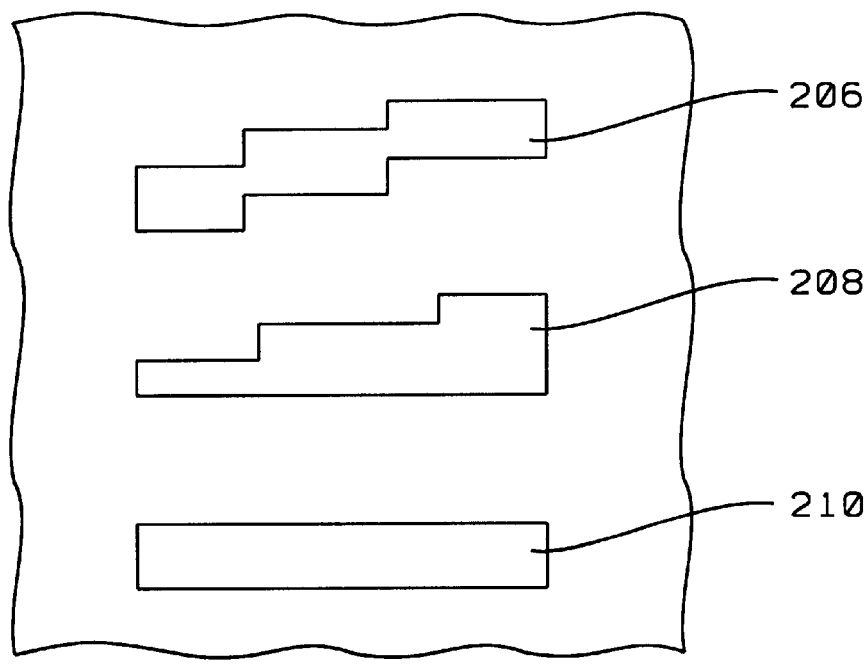
FIG. 6B shows the cutting mask for the modified pattern of FIG. 5.

FIG. 6A shows a top view of the first mask showing the extended line segments 204. The extended line segments 204 will be opaque regions on the first mask. FIG. 6B shows a top view of the second mask or cutting mask showing the cutting elements 206, 208, and 210. The cutting elements 206, 208, and 210 are transparent regions of the cutting mask.

Figure 7:
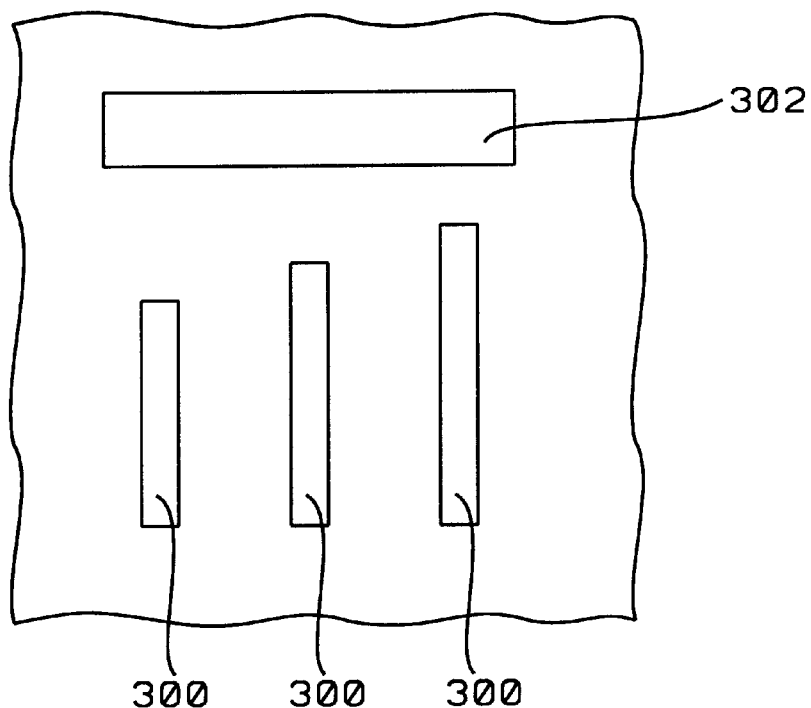
FIG. 7 shows a pattern having a line segments in perpendicular directions.
Figure 8:
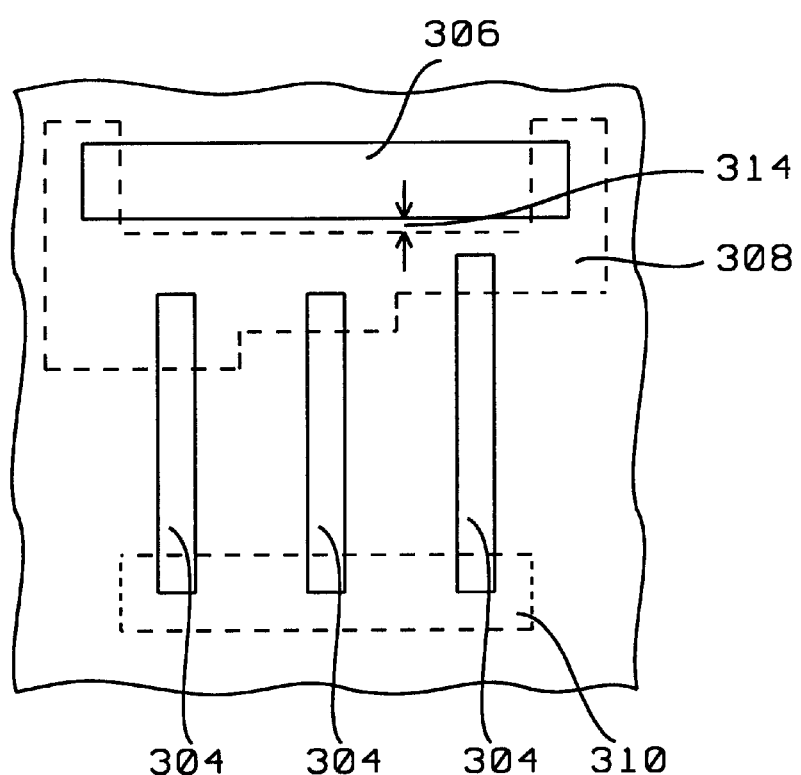
FIG. 8 shows the modified pattern and cutting pattern for the pattern of FIG. 7.

FIG. 7 shows a top view of a mask having line segments 300 and 302 in a T pattern. FIG. 8 shows the layout pattern for the extended line segments 304 and 306 of the first mask and the cutting elements 308 and 310 for the cutting mask. The rules for forming the vertical extended line segments 304, the horizontal extended line segment 306, and the cutting element 310 used to trim the bottom end of the vertical extended line segments 304 are the same as described in previous examples. A new ground rule introduced in this example requires a gap 314 between the edge of the cutting element 308 used to cut the top ends of the vertical extended line segments 304 and the ends of the horizontal extended line segment 306. This gap must be greater than twice the root mean square sum of the stage accuracy and mask overlay errors for the mask alignment and projection system shown in FIG. 19.

Figure 9A:
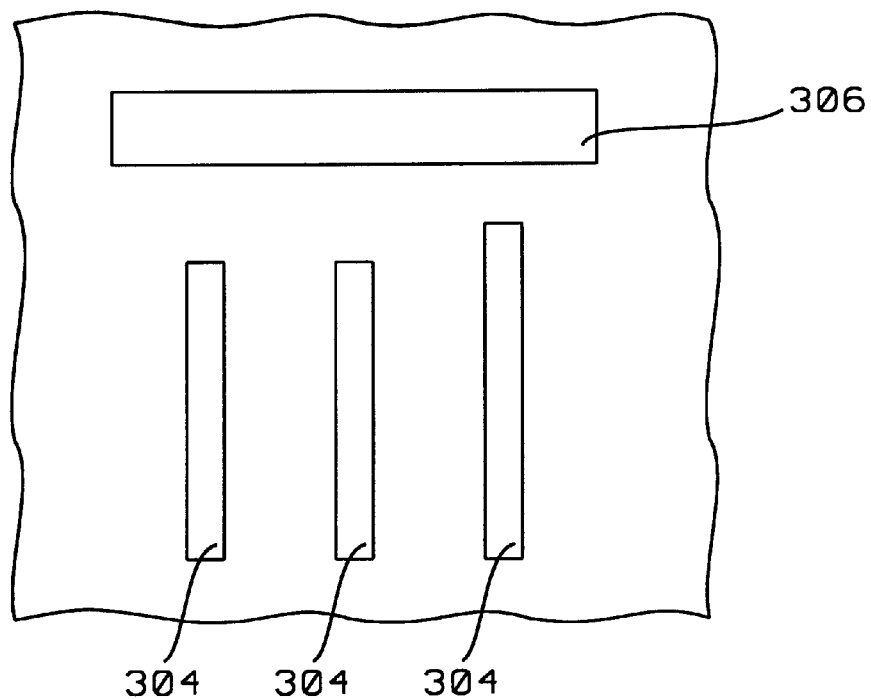
FIG. 9A shows the mask for the modified pattern of FIG. 8.

FIG. 9A shows a top view of the first mask showing the extended line segments 304 and 306. The extended line segments 304 and 306 will be opaque regions on the first mask.

Figure 9B:
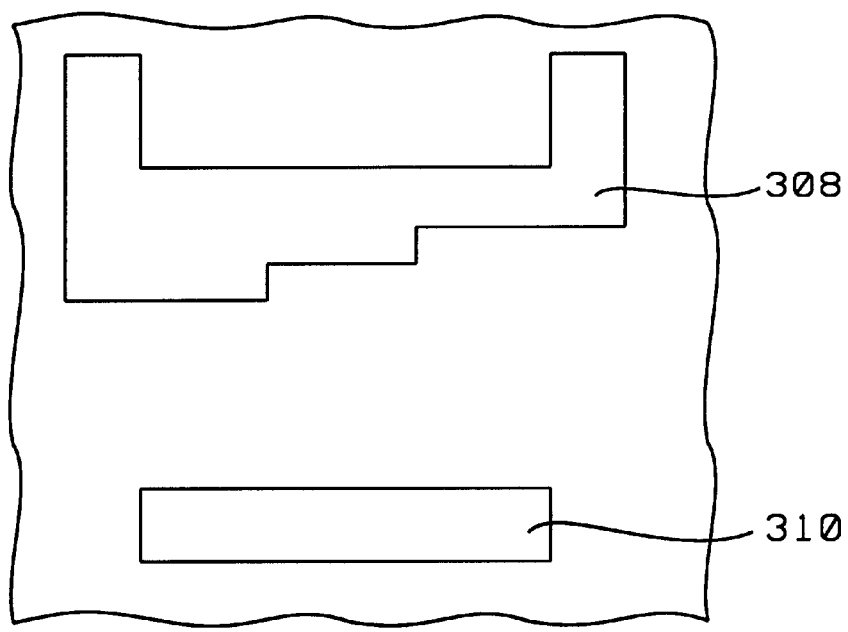
FIG. 9B shows the cutting mask for the modified pattern of FIG. 8.

FIG. 9B shows a top view of the second mask or cutting mask showing the cutting elements 308 and 310. The cutting elements 308 and 310 are transparent regions of the cutting mask.

Figure 10:
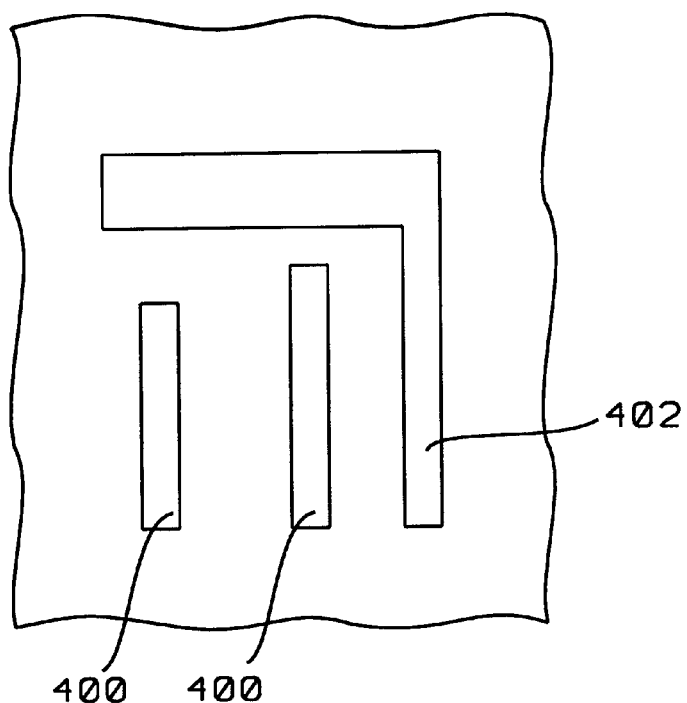
FIG. 10 shows a pattern having a number of line segments in additional to an L pattern element.
Figure 11:
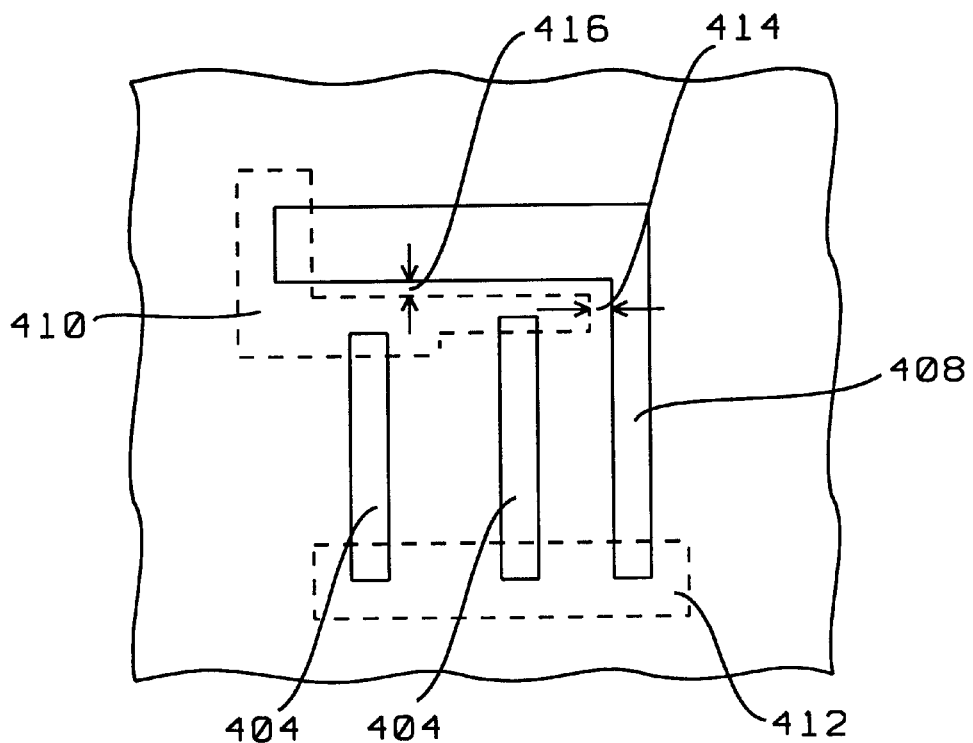
FIG. 11 shows the modified pattern and cutting pattern for the pattern of FIG. 10.

FIG. 10 shows a top view of a mask having straight line segments 400 and an L shaped line segment 402. FIG. 11 shows the layout pattern for the extended line segments 404 and 408 of the first mask and the cutting elements 410 and 412 for the cutting mask. The rules for forming the extended line segments 404 and 408 and the cutting elements 410 and 412 are the same as described in previous examples. A new ground rule introduced in this example requires gaps 414 and 416 between the edge of the cutting element 410 and adjacent line segments 408. These gaps must each be greater than twice the root mean square sum of the stage accuracy and mask overlay errors for the mask alignment and projection system shown in FIG. 19.

Figure 12A:
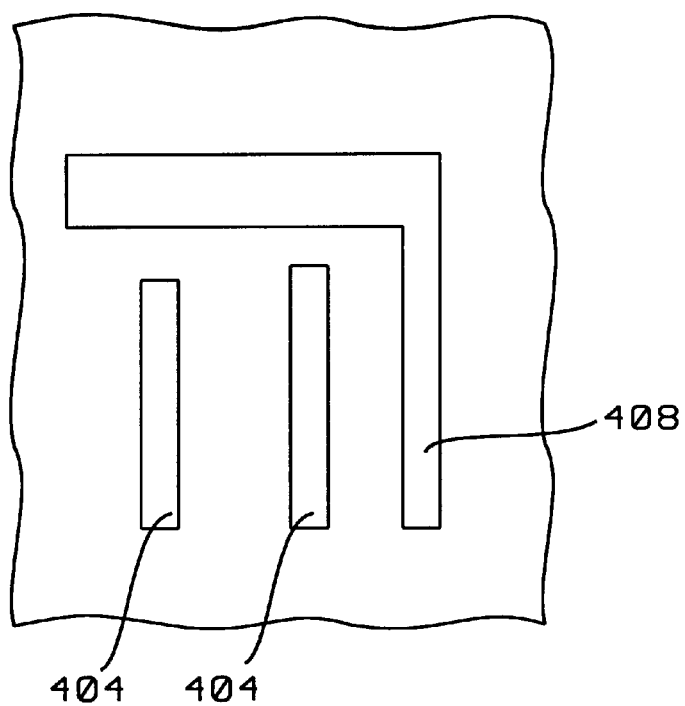
FIG. 12A shows the mask for the modified pattern of FIG. 11.
Figure 12B:
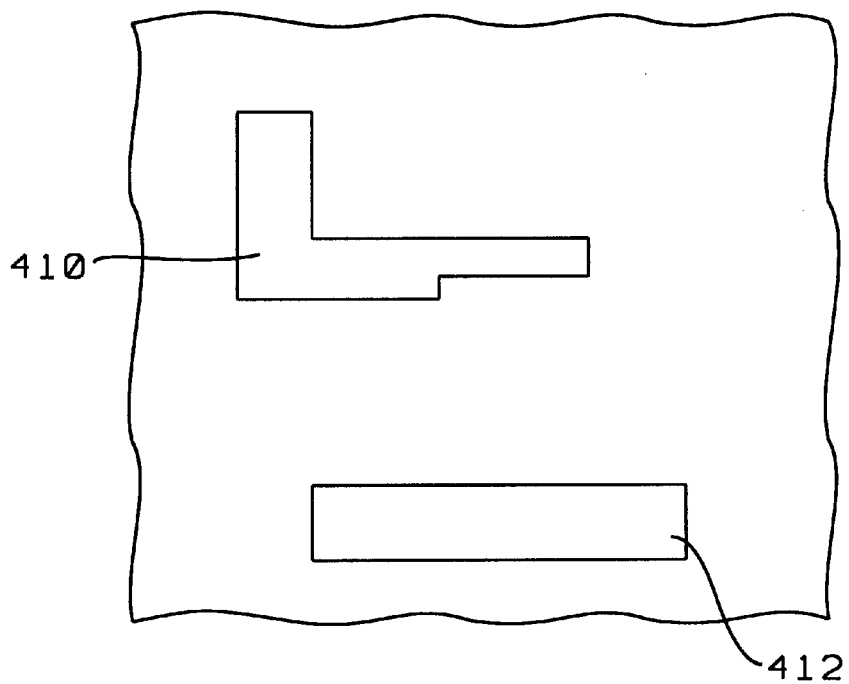
FIG. 12B shows the cutting mask for the modified pattern of FIG. 11.

FIG. 12A shows a top view of the first mask showing the extended line segments 404 and 408. The extended line segments 404 and 408 will be opaque regions on the first mask. FIG. 12B shows a top view of the second mask or cutting mask showing the cutting elements 410 and 412. The cutting elements 410 and 412 are transparent regions of the cutting mask.

Figure 13:
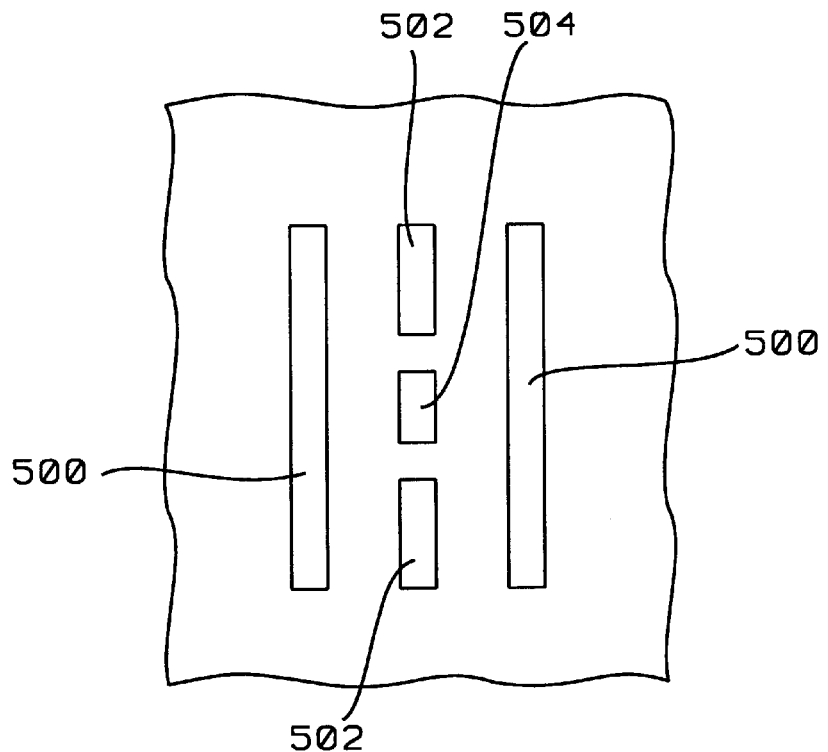
FIG. 13 shows a pattern having a number of line segments arranged in an H pattern.
Figure 14:
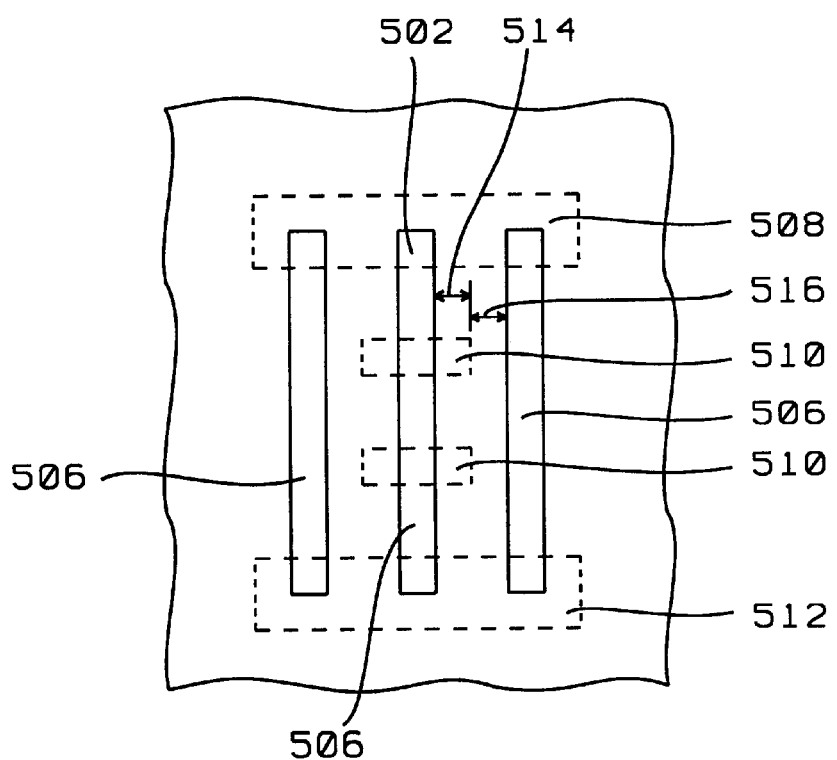
FIG. 14 shows the modified pattern and cutting pattern for the pattern of FIG. 13.

FIG. 13 shows a top view of a mask having straight line segments 500, 502, and 504 forming an H shaped pattern. FIG. 14 shows the layout pattern for the extended line segments 506 of the first mask and the cutting elements 508, 510, and 512 for the cutting mask. The rules for forming the extended line segments 506 and the cutting elements 508, 510, and 512 are the same as described in previous examples. In this pattern the interior cutting elements 510 must extend beyond the edge of the interior extended line segment 506 a distance 514 least 20% larger than the expected largest line shortening of the pattern line segments, 500, 502, and 504 in FIG. 13. There must also be a gap 516 between the edge of the interior cutting elements 510 and adjacent line segments 510. This gap must each be greater than twice the root mean square sum of the stage accuracy and mask overlay errors for the mask alignment and projection system shown in FIG. 19.

Figure 15A:
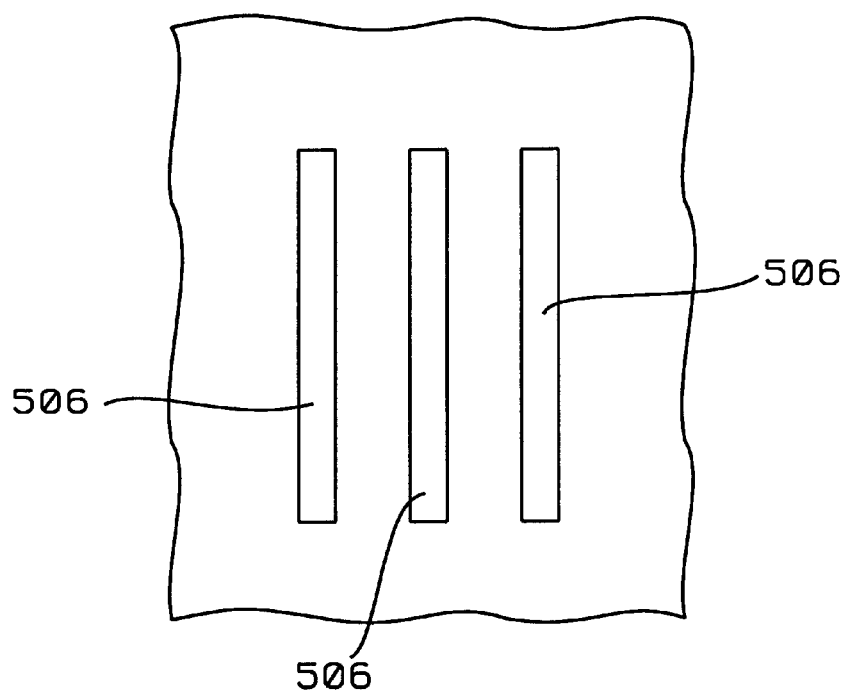
FIG. 15A shows the mask for the modified pattern of FIG. 14.
Figure 15B:
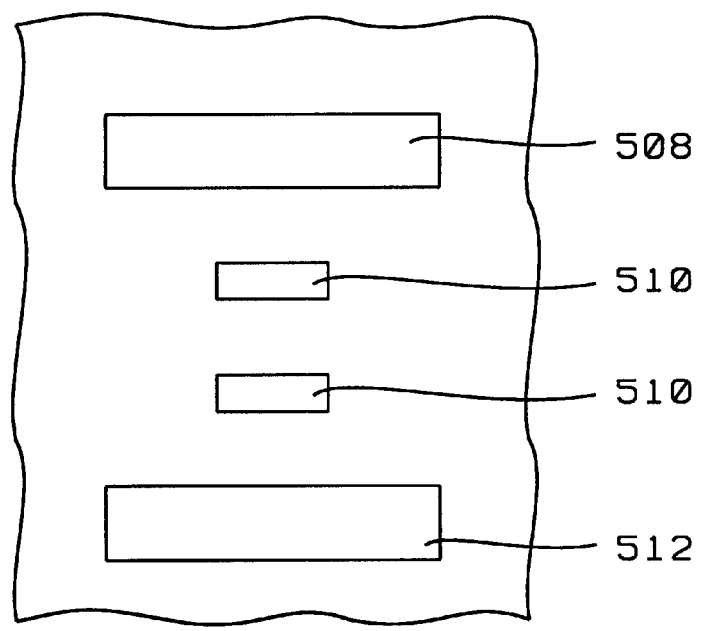
FIG. 15B shows the cutting mask for the modified pattern of FIG. 14.

FIG. 15A shows a top view of the first mask showing the extended line segments 506. The extended line segments 506 will be opaque regions on the first mask. FIG. 15B shows a top view of the second mask or cutting mask showing the cutting elements 508 and 510. The cutting elements 508 and 510 are transparent regions of the cutting mask.

Figure 16:
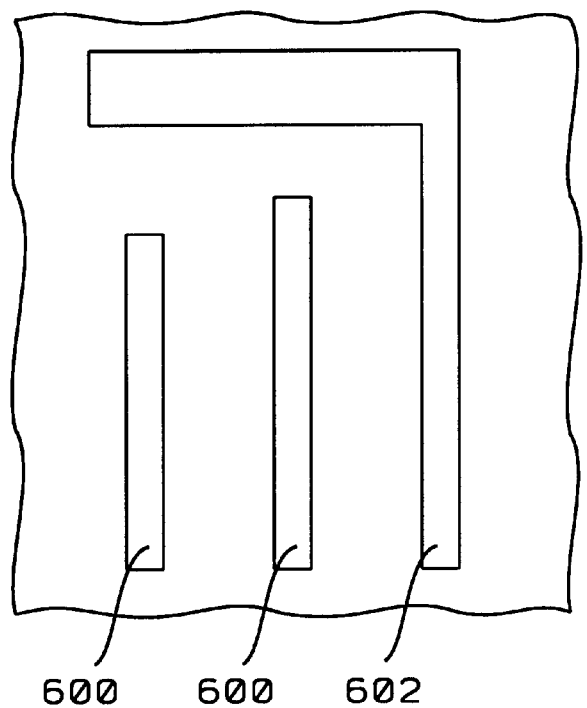
FIG. 16 shows a pattern having pattern openings to form line segments and an L segment.
Figure 17:
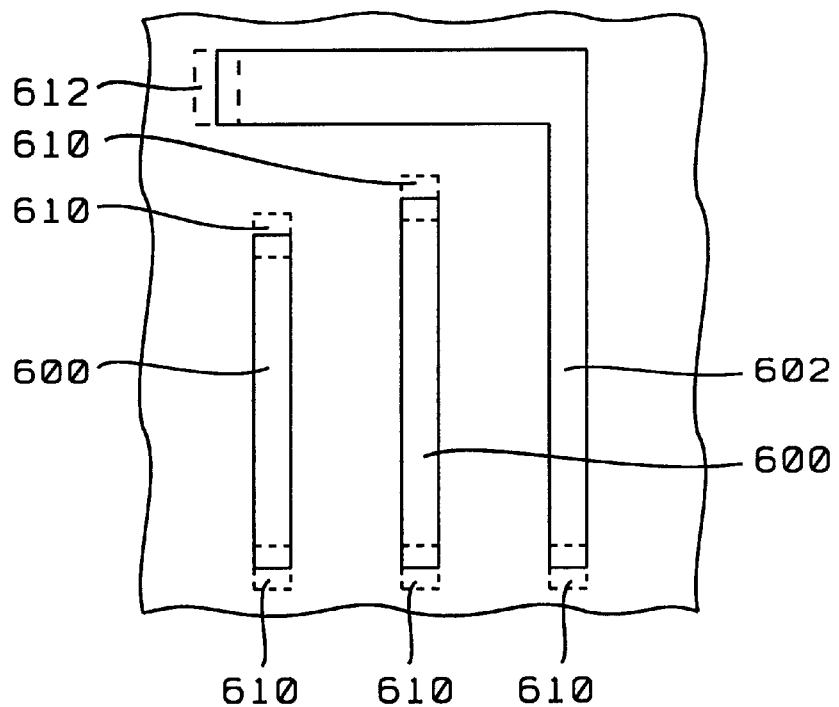
FIG. 17 shows the modified pattern and cutting pattern for the pattern of FIG. 16.

Refer now to FIGS. 16–18B for a description of an embodiment of the masks of this invention having pattern elements corresponding to transparent regions of the mask. FIG. 16 shows a top view of a mask having straight line segments 600 and an L shaped line segment 602. FIG. 17 shows the layout pattern for the first mask having line segments 600 and 602 mask and the cutting elements 610 and 612 for the cutting mask. In this example the line segments 600 and 602 in. the first mask will be transparent regions in an otherwise opaque mask and will be the same size and shape as the line segments and L shaped segment in the original pattern mask. Since exposure of a layer of resist using this mask will shorten these pattern elements the cutting mask also has transparent cutting elements 610 and 610 which will lengthen these pattern elements in the second exposure. The cutting elements 610 and 612 have the same width as the corresponding line elements 600 and 602 but serve the purpose of extending these line segments in a second exposure.

Figure 18A:
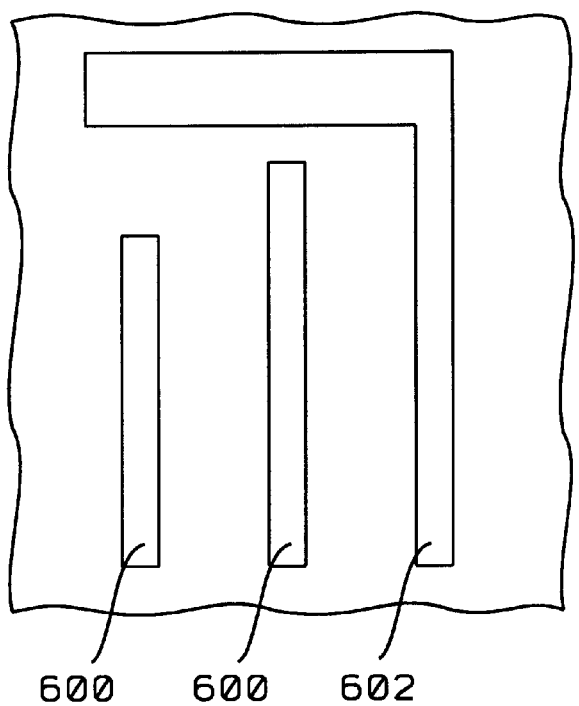
FIG. 18A shows the mask for the modified pattern of FIG. 17.
Figure 18B:
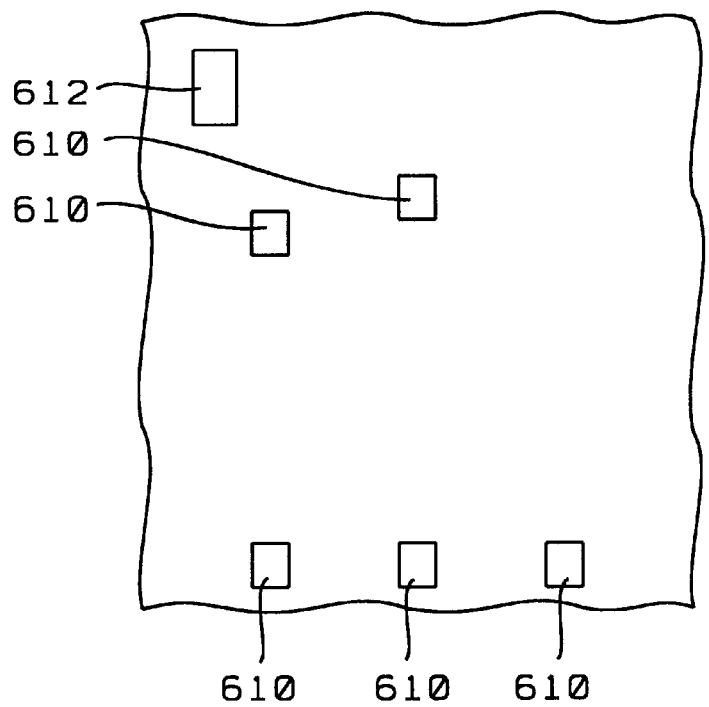
FIG. 18B shows the cutting mask for the modified pattern of FIG. 17.
Figure 19:
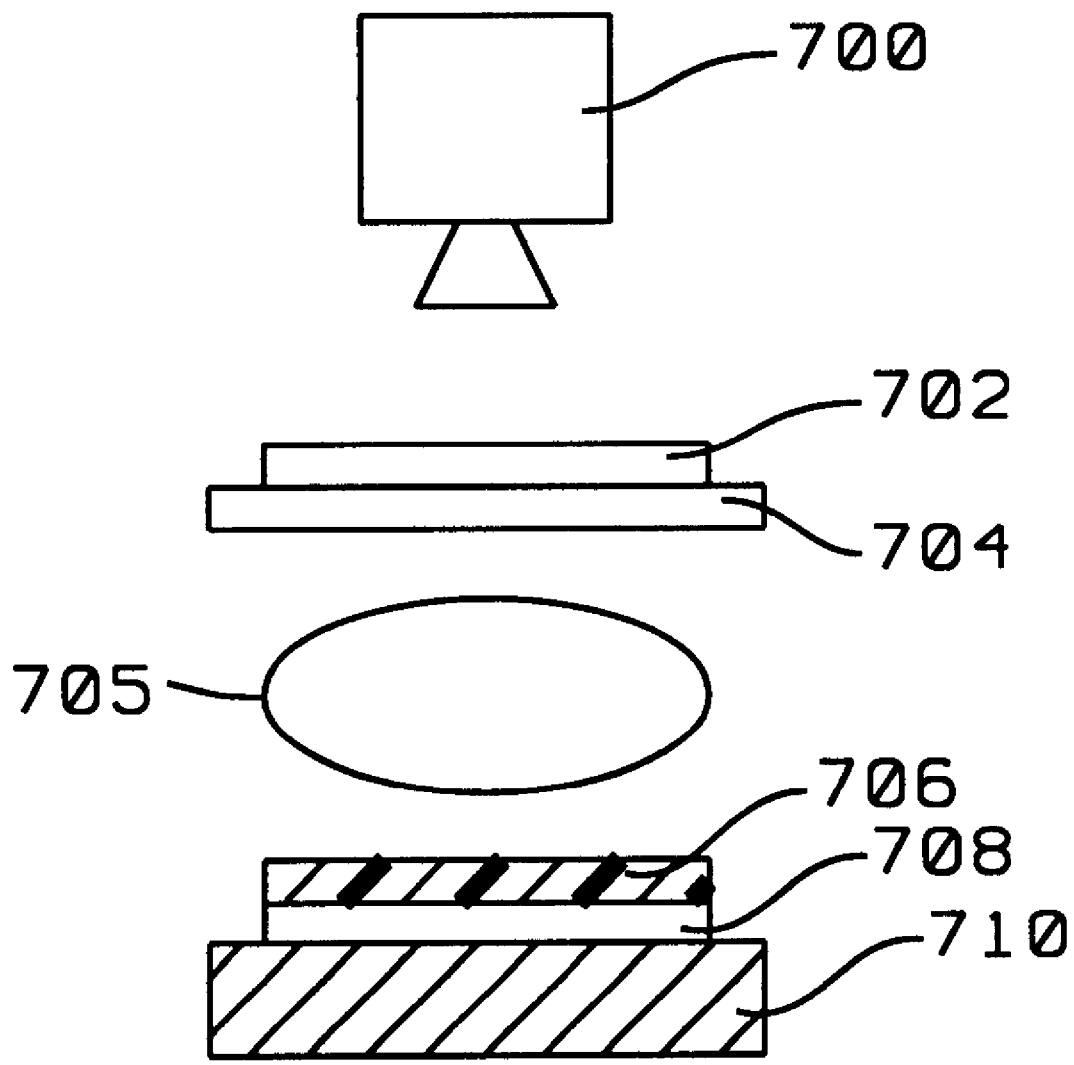
FIG. 19 shows a schematic diagram of a mask alignment and projection system.

FIG. 18A shows a top view of the first mask showing the line segments 600 and L shaped segment 602. The line segments 600 and L shaped segment 602 are transparent regions of the first mask. FIG. 18B shows a top view of the second mask or cutting mask showing the cutting elements 610 and 612. The cutting elements 610 and 612 are transparent regions of the cutting mask.

These embodiments have described first exposing a layer of resist using a first mask followed by exposure using a cutting mask. The method of this invention will work equally well by first exposing the layer of resist using the cutting mask followed by a second exposure using the first mask. The masks and method of all the embodiments described herein will work equally well for forming images in either positive or negative resist.

While the invention has been particularly shown and described with reference to the preferred embodiments thereof, it will be understood by those skilled in the art that various changes in form and details may be made without departing from the spirit and scope of the invention.

What is claimed is:

1. A method of forming images compensated for line shortening, comprising:

providing a mask alignment and projection system;

providing a substrate having a layer of resist formed thereon;

providing a pattern having pattern elements comprising a number of line segments, wherein said line segments have one or two free ends which are not connected to other mask pattern elements;

forming extended line segments by adding line extensions to said free ends of said line segments thereby forming a modified pattern, wherein each of said line extensions are equal to or greater than a first distance;

forming a cutting pattern comprising rectangles enclosing each of said line extensions wherein one of the sides of said rectangles is coincident with the corresponding said free end of said line segment, said rectangle has a height equal to a second distance, and a width;

forming a first mask having opaque regions corresponding to said extended line segments in said modified pattern;

forming a second mask having transparent regions corresponding to said rectangles in said cutting pattern;

exposing said layer of resist using a first exposure, said first mask, and said mask alignment and projection system;

exposing said layer of resist using a second exposure, said second mask, and said mask alignment and projection system; and developing said layer of resist.

2. The method of claim 1 wherein for two of said line segments said line extensions added to the nearest ends of these said line segments is sufficient to make the nearest ends of said extended line segments corresponding to these two said line segments contact each other if the centerlines of these two said line segments are parallel, the distance between the centerlines of these two said line segments is less than or equal to one half the sum of the line width of these two said line segments, and the distance between the nearest ends of these two said line segments is less than ten multiplied by the largest expected line shortening for the corresponding said line segments.

3. The method of claim 1 wherein said first distance is the largest expected line shortening for one end of said line segments.

4. The method of claim 1 wherein said second distance is greater than two multiplied by the largest expected line shortening for one end of said line segments.

5. The method of claim 1 wherein the distance between the each of the sides of said line extensions and the nearest parallel side of said rectangle is greater than the largest expected line shortening for one end of said line segments.

6. The method of claim 1 wherein the boundaries of said rectangles are a third distance away from any pattern elements other than the line segment corresponding to said rectangle.

7. The method of claim 6 wherein said third distance is between zero and two multiplied by the root mean square sum of the stage accuracy and mask overlay errors for said mask alignment and projection system.

8. A method of forming images compensated for line shortening, comprising:

providing a mask alignment and projection system;

providing a substrate having a layer of resist formed thereon;

providing a pattern comprising line segments wherein said line segments have one or two free ends which are not connected to other mask pattern elements;

forming a cutting pattern comprising rectangles wherein said rectangles have the same width as said line segments, add a first distance to each of said free ends of said line segments, and overlap said free ends of said line segments by a second distance;

forming a first mask having transparent regions corresponding to said line segments in said pattern;

forming a second mask having transparent regions corresponding to said rectangles in said cutting pattern;

exposing said layer of resist using a first exposure, said first mask, and said mask alignment and projection system;

exposing said layer of resist using a second exposure, said second mask, and said mask alignment and projection system; and developing said layer of resist.

9. The method of claim 8 wherein said first distance is the largest expected line shortening for one end of said line segments.

10. The method of claim 8 wherein said second distance is greater than the largest expected line shortening for one end of said line segments.

11. A mask set for forming images in a layer of resist compensated for line shortening, comprising:

a pattern having pattern elements comprising a number of line segments, wherein said line segments have one or two free ends which are not connected to other mask pattern elements;

line extensions added to each of said free ends of said line segments thereby forming a modified pattern, wherein each of said line extensions are equal to or greater than a first distance;

a cutting pattern comprising rectangles enclosing each of said line extensions wherein one of the sides of said rectangles is coincident with the corresponding said free end of said line segment, said rectangle has a height equal to a second distance, and a width;

a first mask having opaque regions corresponding to said line extensions of said modified pattern; and a second mask having transparent regions corresponding to said rectangles of said cutting pattern.

12. The mask set of claim 11 wherein for two of said line segments said line extensions added to the nearest ends of these said line segments is sufficient to make the nearest ends of said extended line segments corresponding to these two said line segments contact each other if the centerlines of these two said line segments are parallel, the distance between the centerlines of these two said line segments is less than or equal to one half the sum of the line width of these two said line segments, and the distance between the nearest ends of these two said line segments is less than ten multiplied by the largest expected line shortening for the corresponding said line segments.

13. The mask set of claim 11 wherein said first distance is the largest expected line shortening for one end of said line segments.

14. The mask set of claim 11 wherein said second distance is greater than two multiplied by the largest expected line shortening for one end of said line segments.

15. The mask set of claim 11 wherein the distance between the each of the sides of said line extensions and the nearest parallel side of said rectangle is greater than the largest expected line shortening for one end of said line segments.

16. The mask set of claim 11 wherein the boundaries of said rectangles are a third distance away from any pattern elements other than the line segment corresponding to said rectangle.

17. The mask set of claim 16 wherein said third distance is between zero and two multiplied by the root mean square sum of the stage accuracy and mask overlay errors for said mask alignment and projection system.

18. A mask set for forming images in a layer of resist compensated for line shortening, comprising:

a pattern comprising a number of line segments, wherein said line segments have one or two free ends which are not connected to other mask pattern elements;

a cutting pattern comprising rectangles, wherein said rectangles have the same width as said line segments, add a first distance to each of said free ends of said line segments, and overlap said free ends of said line segments by a second distance;

a first mask having transparent regions corresponding to said line segments in said pattern; and a second mask having transparent regions corresponding to said rectangles in said cutting pattern.

19. The method of claim 18 wherein said first distance is the largest expected line shortening for one end of said line segments.

20. The method of claim 18 wherein said second distance is greater than the largest expected line shortening for one end of said line segments.

* * * * *